United States Patent
Morishita

(10) Patent No.: US 6,894,321 B2
(45) Date of Patent: May 17, 2005

(54) ESD PROTECTION CIRCUIT WITH PLURAL THYRISTORS

(75) Inventor: Yasuyuki Morishita, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/689,723

(22) Filed: Oct. 22, 2003

(65) Prior Publication Data
US 2004/0084730 A1 May 6, 2004

(30) Foreign Application Priority Data
Oct. 22, 2002 (JP) ........................................ 2002-306992

(51) Int. Cl.[7] .............................................. H01L 29/72
(52) U.S. Cl. ...................................................... 257/173
(58) Field of Search ................................ 257/107, 173, 257/355, 335, 360, 361, 362

(56) References Cited

U.S. PATENT DOCUMENTS
6,188,088 B1 * 2/2001 Ramakrishnan

FOREIGN PATENT DOCUMENTS
JP   63-036557   2/1988
JP   10-173134   6/1998

* cited by examiner

Primary Examiner—Nathan J. Flynn
Assistant Examiner—Kevin Quinto
(74) Attorney, Agent, or Firm—Young & Thompson

(57) ABSTRACT

A LSI has a plurality of separate power source systems, and an ESD protection circuit connected between ground lines of two of the power source systems. The protection circuit includes a pair of thyristors connected parallel to one another in opposite directions between the ground lines.

11 Claims, 13 Drawing Sheets

US 6,894,321 B2

ESD PROTECTION CIRCUIT WITH PLURAL THYRISTORS

BACKGROUND OF THE INVENTION (a) Field of the Invention

The present invention relates to an electrostatic discharge (ESD) protection circuit and, more particularly, to an ESD protection circuit used in a semiconductor device having a plurality of power source systems isolated from one another.

(b) Description of the Related Art

A semiconductor device (hereinafter referred to as LSI) may have a plurality of power source systems therein for use in different internal circuits. For example, in a LSI including an analog circuit and a digital circuit in a single LSI chip, separate power source lines and separate ground lines are used for the analog circuit and the digital circuit to prevent the power source voltage for the analog circuit from fluctuating due to the operations in the digital circuit, in consideration that the analog circuit is more susceptible to the voltage fluctuation.

On the other hand, in a LSI having therein a memory circuit and a CMOS buffer circuit which is capable of driving a large-capacity external load in a single LSI chip, separate power source lines and separate ground lines may be provided for the memory circuit and the CMOS buffer circuit for preventing the power source voltage of the memory circuit from fluctuating due to the voltage fluctuation caused by the buffer circuit driving the external load, in consideration that the memory circuit is more susceptible to the fluctuation of the power source voltage.

Patent Publications JPA-1988-36557 and -1998-173134 describe ESD protection circuits provided in LSIs each having a plurality of power source systems therein. FIG. 10 exemplifies a conventional ESD protection circuit provided between different power source systems and described in the above publications, illustrating an equivalent circuit diagram of the ESD protection circuit 100 provided between ground line GND1 of the power source system of a first internal circuit and ground line GND2 of the power source system of a second internal circuit of the LSI. Although not specifically shown in the publications, the layout pattern of the ESD protection circuit may be such that shown in FIG. 11, with reference to which the conventional ESD protection circuit will be described hereinafter. FIGS. 12A and 13A show sectional views taken along lines P–P' and Q–Q', respectively, in FIG. 11, whereas FIGS. 12B and 13B show equivalent circuit diagrams corresponding to FIGS. 12A and 13A, respectively.

The ESD protection circuit, generally designated at numeral 100, includes two diodes, diode 110 and diode 120, connected in parallel in the opposite directions. More specifically, the anode of diode 110 and the cathode of diode 120 are connected together to ground line GND1, whereas the cathode of diode 110 and the anode of diode 120 are connected together to ground line GND2. Diode 110 includes a P-well 111 formed on the main surface of a P-type silicon substrate 103 on which desired circuit elements are formed, an N-well 112 formed in the P-well 111, a heavily-doped P-type diffusion region 113 formed in the N-well 112 and connected to ground line GND1, and a heavily-doped N-type diffusion region 114 formed in the N-well 112 and connected to ground line GND2.

Diode 120 includes a P-well 121 formed on the main surface of the P-type silicon substrate 103, an N-well 122 formed in the P-well 121, a heavily-doped N-type diffusion region 124 formed in the N-well 122 and connected to ground line GND1, and a heavily-doped P-type diffusion region 123 formed in the N-well 122 and connected to ground line GND2. A heavily-doped P-type diffusion region 115 constituting a guard ring acts as a well contact for the P-well and a substrate contact for the silicon substrate 103, whereas a heavily-doped P-type diffusion region 125 acts as a well contact for the P-well 121 and a substrate contact for the silicon substrate 103.

In the configuration as described above, if an ESD stress is applied between ground line GND1 and ground line GND2, with ground line GND1 being positive with respect to ground line GND2, for example, diode 110 acts as the protection device. In this case, a forward current I1 flows from heavily-doped P-type diffusion region 113 constituting the anode of diode 110 to ground line GND2 via heavily-doped P-type diffusion region 114 constituting the cathode of diode 110, whereby a parasitic PNP transistor formed by heavily-doped P-type diffusion region 113, N-well 112 and P-well 111 is turned ON to conduct a current I2 therethrough.

On the other hand, if the ESD stress is such that ground line GND2 is positive with respect to ground line GND1, diode 120 acts as the protection device. In this case, although a forward current I1 flows from heavily-doped P-type diffusion region 123 constituting the anode of diode 120 to ground line GND1 via heavily-doped N-type diffusion region 124 constituting the cathode of diode 120, the parasitic PNP transistor formed by heavily-doped P-type diffusion region 123, N-well 122 and P-well 121 is not turned ON to cause a forward current I3 from P-well 121 to N-well 122 because P-well 121 is connected to ground line GND2 via P-well 125 constituting the well contact.

In the conventional ESD protection circuit wherein diodes are connected in parallel in the opposite directions as described above, although the parasitic PNP transistor is turned ON to form a discharge path for the ESD current as in the case of diode 110 acting as the protection device, the current gain of the parasitic PNP transistor is quite small. Thus, for assuring a sufficient ESD robustness by employing a low resistance against the ESD current, the dimensions of diodes 110 and 120 constituting the protection devices must be large. However, the larger dimensions of the diodes constituting the protection devices cause a higher parasitic capacitance between ground line GND1 and ground line GND2, which involves the problem that a high-frequency noise is more likely to transfer therebetween during a normal operation of the LSI.

In view of the above problem of the conventional ESD protection circuit, it is an object of the present invention to provide an ESD protection circuit in an LSI having a plurality of power source systems, which has a sufficient ESD robustness and is capable of suppressing a high-frequency noise from transferring between the ground lines of the power source systems during the normal operation of the LSI.

SUMMARY OF THE INVENTION

The present invention provides, in one aspect thereof, an electrostatic discharge (ESD) protection circuit including: first and second nodes: a first thyristor having an anode connected to the first node, and a cathode and a gate both connected to the second node; and a second thyristor having an anode connected to the second node, and a cathode and a gate both connected to the first node, whereby the ESD protection circuit discharges an ESD stress, applied to the first node, toward the second node, and discharges an ESD stress, applied to the second node, toward the first node.

The present invention provides, in another aspect thereof, an ESD protection circuit formed on a semiconductor substrate of a first conductivity type, including: first and second nodes; a first well of a second conductivity type opposite to the first conductivity type, a second well of the second conductivity type disposed apart from the first well, and a third well of the first conductivity type encircling the first and second wells and connected to the first node, the first through third wells being formed in a surface region of the semiconductor substrate; a first diffusion region of the second conductivity type, having a higher impurity concentration than the first well, formed in the third well to oppose the first well, and connected to the first node; a second diffusion region of the second conductivity type, having a higher impurity concentration than the second well, formed in the third well to oppose the second well, and connected to the second node; a third diffusion region of the second conductivity type, having a higher impurity concentration than the first well, formed in the first well, and connected to the first node; a fourth diffusion region of the second conductivity type, having a higher impurity concentration than the second well, formed in the second well, and connected to the second node; a fifth diffusion region of the first conductivity type, having a higher impurity concentration than the third well, formed in the first well apart from the third well, and connected to second node; and a sixth diffusion region of the first conductivity type, having a higher impurity concentration than the third well, formed in the second well apart from the fourth diffusion region, and connected to the first node.

The present invention also provide, in another aspect thereof, an ESD protection circuit formed on a semiconductor substrate of a first conductivity type, including: first and second lines; a first well of a second conductivity type opposite to the first conductivity type, a second well of the second conductivity type disposed apart from the first well, a third well of the first conductivity type encircling the first well and connected to the first line, and a fourth well of the first conductivity type encircling the second well, disposed apart from the third well and connected to the second line, the first through fourth wells being formed in a surface region of the semiconductor substrate; a first diffusion region of the second conductivity type, having a higher impurity concentration than the first well, formed in the third well to oppose the first well, and connected to the first line; a second diffusion region of the second conductivity type, having a higher impurity concentration than the second well, formed in the fourth well to oppose the second well, and connected to the second line; a third diffusion region of the second conductivity type, having a higher impurity concentration than the first well, formed in the first well, and connected to the first line; a fourth diffusion region of the second conductivity type, having a higher impurity concentration than the second well, formed in the second well, and connected to the second line; a fifth diffusion region of the first conductivity type, having a higher impurity concentration than the third well, formed in the first well apart from the third well, and connected to second line; and a sixth diffusion region of the first conductivity type, having a higher impurity concentration than the fourth well, formed in the second well apart from the fourth diffusion region, and connected to the first line.

The present invention provides, in another aspect thereof, an ESD protection circuit formed on a semiconductor substrate of a first conductivity type, including: first and second lines; a first well of a second conductivity type opposite to the first conductivity type, a second well of the second conductivity type disposed apart from the first well, a third well of the first conductivity type encircling the first well and connected to the first line, and a fourth well of the first conductivity type encircling the second well, disposed apart from the third well and connected to the first line, the first through fourth wells being formed in a surface region of the semiconductor substrate; a first diffusion region of the second conductivity type, having a higher impurity concentration than the first well, formed in the third well to oppose the first well, and connected to the first line; a second diffusion region of the second conductivity type, having a higher impurity concentration than the second well, formed in the fourth well to oppose the second well, and connected to the second line; a third diffusion region of the second conductivity type, having a higher impurity concentration than the first well, formed in the first well, and connected to the first line; a fourth diffusion region of the second conductivity type, having a higher impurity concentration than the second well, formed in the second well, and connected to the second line; a fifth diffusion region of the first conductivity type, having a higher impurity concentration than the third well, formed in the first well apart from the third well, and connected to second line; and a sixth diffusion region of the first conductivity type, having a higher impurity concentration than the fourth well, formed in the second well apart from the fourth diffusion region, and connected to the first line.

In accordance with the ESD protection device of the present invention, an ESD stress can be effectively discharged between separate power source lines (such as ground lines) having an equal voltage during the normal operation of the LSI, while suppressing high-frequency noise from transferring between the separate power source lines.

PREFERRED EMBODIMENTS OF THE INVENTION

Figure 1:
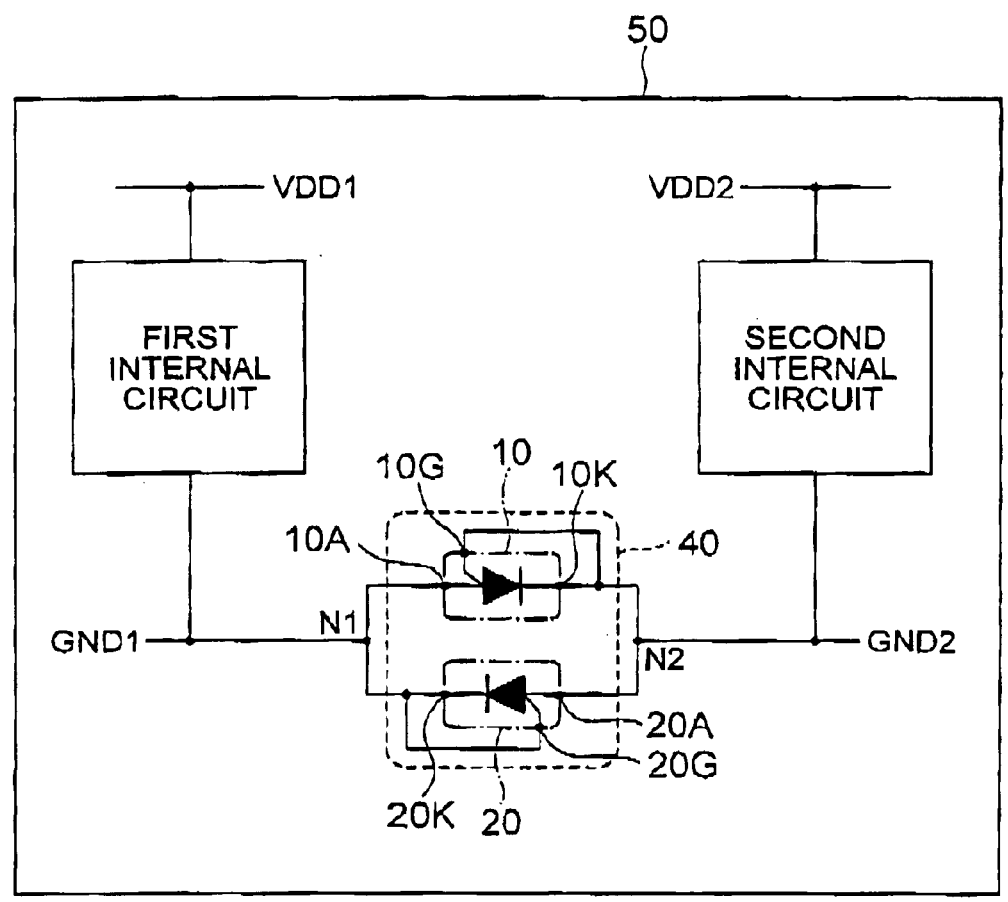
FIG. 1 is an equivalent circuit diagram of an ESD protection circuit according to an embodiment of the present invention.

Referring to FIG. 1, there is shown an equivalent circuit of an LSI including an ESD protection circuit according to a first embodiment of the present invention, which is connected between the ground lines of two different power source systems. The LSI 15 shown in FIG. 1 includes a first internal circuit driven by a first power source system having a high-potential source line VDD1 and a low-potential source line, or ground line GND1, and a second internal circuit driven by a second power source system having a high-potential source line VDD2 and a ground line GND2, wherein ground line GND1 and GND2 are connected to first and second ground terminals, respectively. The ESD protection circuit 40 of the present embodiment is connected between ground line GND1 and ground line GND2. The ESD protection circuit 40 includes a thyristor 10 having an anode 10A connected to a first node N1, and a cathode 10K and a gate 10G connected together to a second node N2, and thyristor 20A having an anode 20A connected to the second node N2 and a cathode 20K and a gate 20G connected together to the first node N1. Other terminals such as the input/output terminals of LSI 15 are omitted for depiction for simplification purpose.

Figure 2:
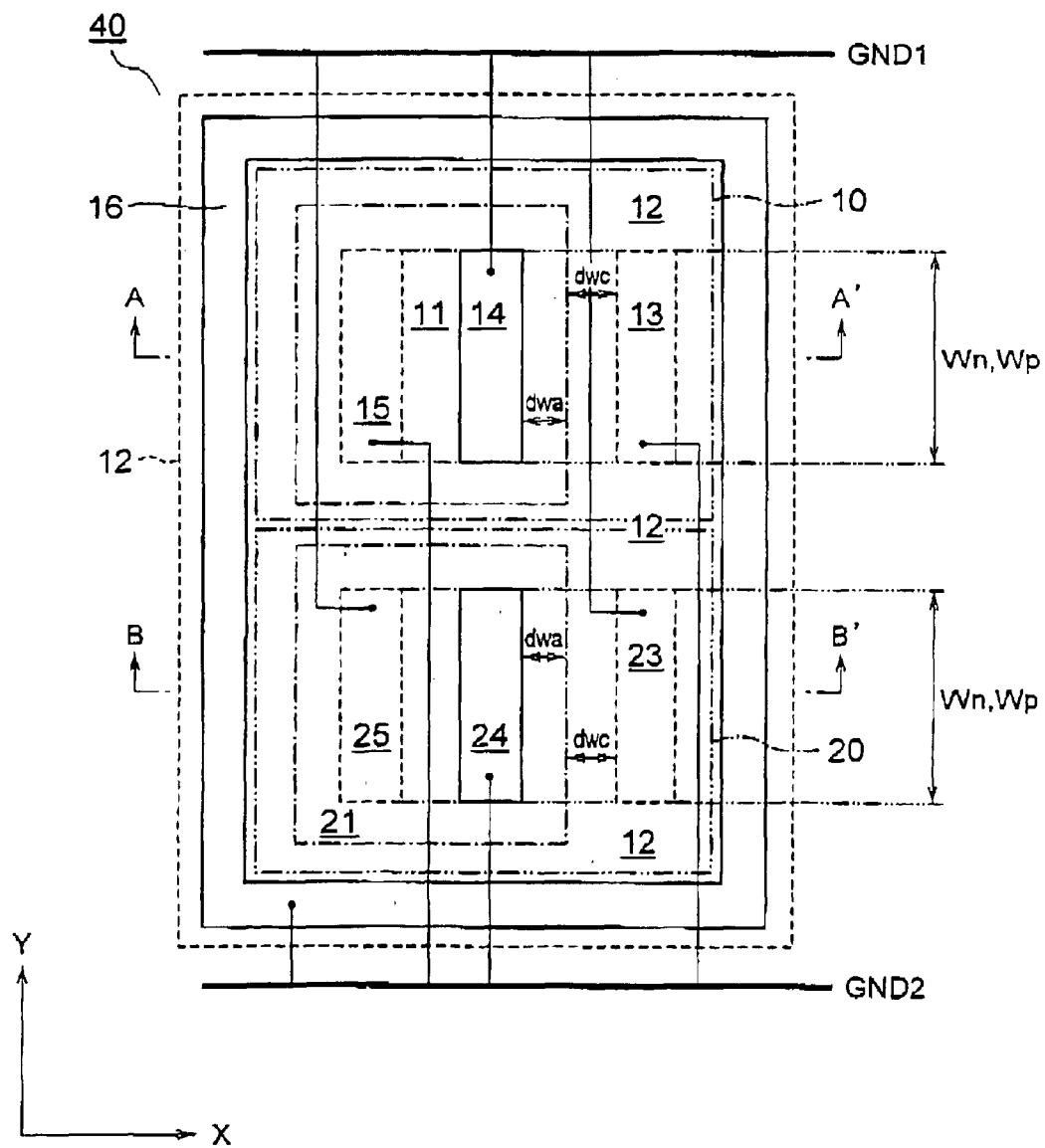
FIG. 2 is a schematic top plan view showing the layout pattern of the ESD protection circuit of FIG. 1.
Figure 3A:
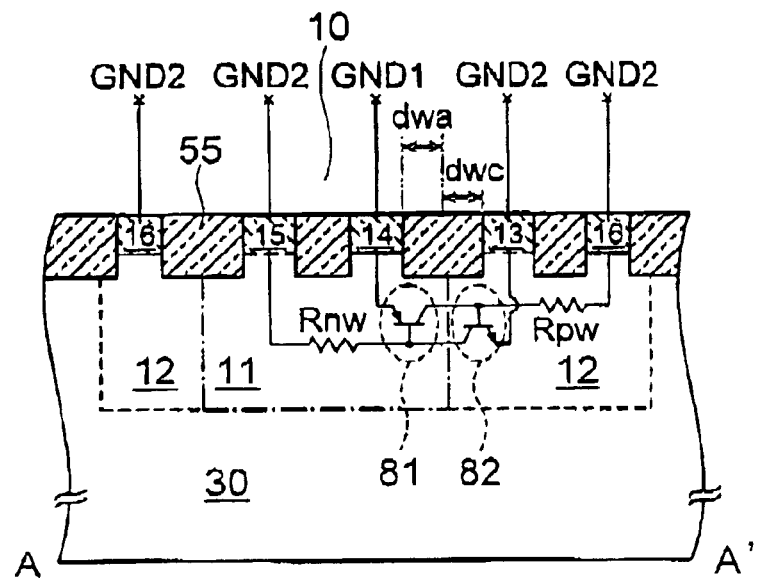
FIGS. 3A and 3B are sectional view taken along line A–A' in FIG. 2, and a corresponding equivalent circuit diagram, respectively.
Figure 3B:
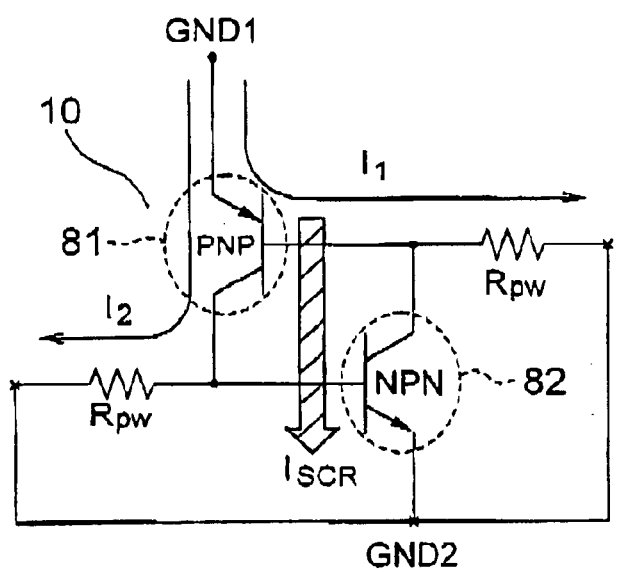
Figure 4A:
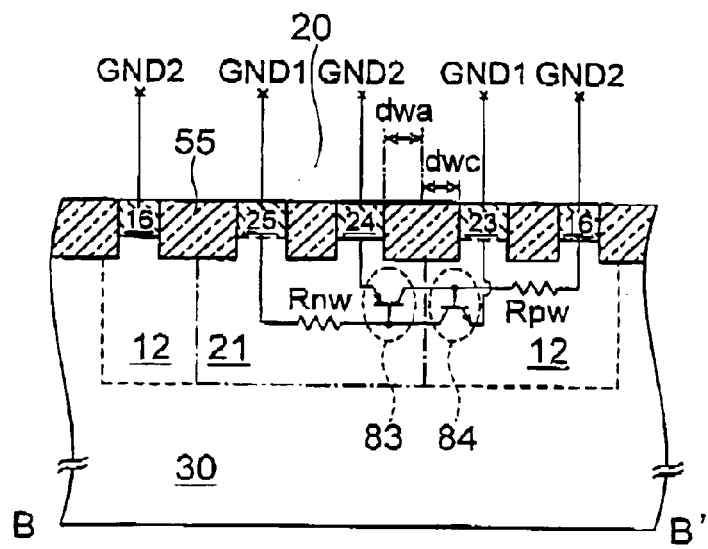
FIGS. 4A and 4B are sectional view taken along line B–B' in FIG. 2, and a corresponding equivalent circuit diagram, respectively.
Figure 4B:
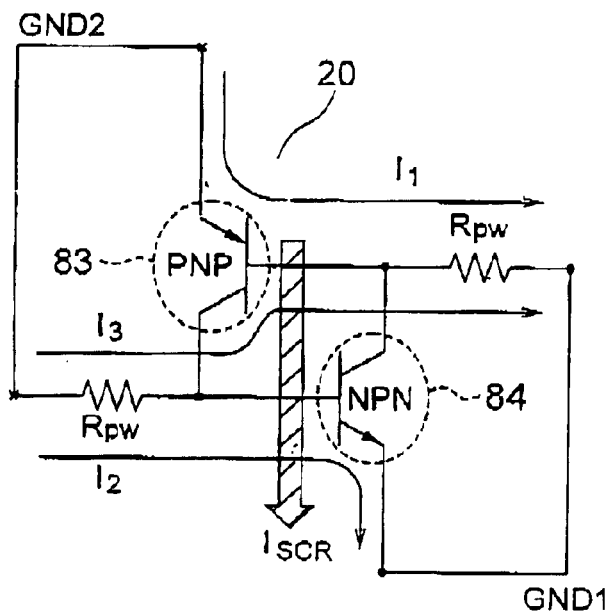

FIG. 2 shows the layout pattern of the ESD protection circuit 40 of FIG. 1, FIGS. 3A and 3B are sectional views taken long lines A–A' in FIGS. 2 and an equivalent circuit diagram thereof, and FIG. 4 is a sectional view taken along line B–B' in FIG. 2. The silicon substrate 30 of a P-conductivity type mounting thereon the ESD protection circuit 40 of the present embodiment has a specific resistivity of 3 to 10 Ω·cm, and includes therein an N-well (first well) 11, an N-well (second well) 21 disposed apart from N-well 11, and a P-well (third well) 12 encircling N-well 11 and N-well 21, all of which are formed on the main surface of the silicon substrate 30.

A heavily-doped N-type diffusion region (first diffusion region) 13 having a higher impurity concentration than N-well 11 is disposed within P-well 12 opposite to N-well 11 and connected to ground line GND2. Another heavily-doped N-type diffusion region (second diffusion region) 23 having a higher impurity concentration than N-well 21 is disposed within P-Well 12 opposite to N-well 21 and connected to ground line GND1. Another heavily-doped N-type region (third diffusion region) 15 having a higher impurity concentration than N-well 11 is disposed within N-well 11 and connected to ground line GND2. Another heavily-doped N-type region (fourth diffusion region) 25 having a higher impurity concentration than N-well 21 is disposed within N-well 21 and connected to ground line GND1 A heavily-doped P-type diffusion region (fifth diffusion region) 14 having a higher impurity concentration than P-well 12 is disposed within N-well 11 between heavily-doped N-type region 13 and heavily-doped N-type region 15, and connected to ground line N1. Another heavily-doped P-type region (sixth diffusion region) 24 having a higher impurity concentration than P-well 12 is disposed within N-well 21 between heavily-doped N-type region 23 and heavily-doped N-type region 25. Another heavily-doped P-type region (seventh diffusion region) 16 having a higher impurity concentration than P-well 12 is disposed in the peripheral area of P-well 12 and connected to ground line GND2.

In the above configurations, N-well 11, P-well 12, heavily-doped N-type region 13 and heavily-doped P-type region 14 constitute thyristor 10 having cathode, anode and gate at heavily-doped N-type region 13, heavily-doped P-type region 14 and heavily-doped N-type region 15, respectively, whereas N-well 21, P-well 12, heavily-doped N-type region 23 and heavily-doped P-type region 24 constitute thyristor 20 having cathode, anode and gate at heavily-doped N-type region 23, heavily-doped P-type region 24 and heavily-doped N-type region 25.

As depicted in FIG. 2, N-wells 11 and 21 are of a rectangular shape having perpendicular edges extending in X- and Y-directions, and are separated from one another in Y-direction. P-well 12 is of a rectangular shape and receives therein N-wells 11 and 12.

Heavily doped N-type region 13 is of a rectangular shape disposed within P-well 12, separated from N-well 11 in X-direction and having edges extending in Y-direction (Y-direction edges) parallel to and opposite to Y-direction edges of N-well 11.

Heavily doped region 23 is also of a rectangular shape disposed within P-well 12, separated from N-well 21 in X direction and having Y-direction edges parallel to Y-direction edges of N-well 21. Heavily doped region 13 has no opposing portion directly opposing to N-well 21, whereas heavily-doped region 23 has no opposing portion directly opposing to N-well 11.

Heavily doped P-type region 14 and heavily-doped N-type region 15 are disposed within N-well 11 apart from and opposing to one another, with the Y-direction edges of both regions 14 and 15 extending parallel to Y-direction edges of one another.

Heavily doped P-type region 24 is disposed apart from and opposing to heavily-doped N-type region 25 in X-direction, and is sandwiched between heavily-doped N-type region 23 and heavily-doped N-type region 25.

Heavily doped P-type region 16 is disposed in the whole peripheral area of P-well 12, separated from any of N-well 21 and heavily-doped N-type regions 13 and 23, and acts as a contact area for P-well 12 and a guard ring for thyristors 10 and 20.

Thyristor 10 has a four-region structure, wherein P-well 12, heavily-doped N-type region 13, N-well 11 and heavily-doped P-type region 14 constitute a first well of the P-conductivity type (first conductivity type), an N-type (second-conductivity-type) diffusion region formed in the first well, a second well of the second conductivity type formed in the semiconductor substrate and a first-conductivity-type diffusion region formed in the second well. Thyristor 20 has a four-region structure, wherein P-well 12, heavily-doped N-type region 23, N-well 21 and heavily-doped P-type region 24 constitute the first well of the first conductivity type, the second-conductivity-type diffusion region formed in the first well, the second well of the second conductivity type formed in the semiconductor substrate and the first-conductivity-type diffusion region formed in the second well.

In operation of the ESD protection circuit 40 of the present embodiment, if an ESD stress is applied so as to conduct a current from ground line GND1 to ground line GND2, then thyristor 10 functions as the ESD protection device. More specifically, referring to FIGS. 3A and 3B, if a positive ESD stress is applied to ground line GND1, a current I1 flows from heavily-doped P-type region 14, which constitutes the anode 10A of thyristor 10, to ground line GND2 through N-well 11 and heavily-doped N-type region 15. Thus, a parasitic PNP transistor 81 formed by heavily-doped P-type region 14, N-well 11 and P-well 12 is turned ON, followed by turn-ON of another parasitic NPN transistor 82 formed by N-well 11, P-well 12 and heavily-doped N-type region 13 to turn ON thyristor 10, which discharges a current $I_{SCR}$ to ground line GND2 with a low resistance.

On the other hand, if an ESD stress is applied so as to conduct a current from ground line GND2 to ground line GND1, then thyristor 20 functions as the ESD protection device. More specifically, referring to FIGS. 4A and 4B, if a positive ESD stress is applied to ground line GND2, then a current I1 flows from heavily-doped P-type region 24, which constitutes the anode 20A of thyristor 20, to ground line GND1 through N-well 21 and heavily-doped N-type region 25, a current I2 flows from heavily-doped P-type region 16 to ground line GND1 through P-well 12 and heavily-doped N-type region 23, and a current I3 flows from heavily-doped P-type region 16 to ground line GND1 through N-well 21 and heavily-doped N-type region 25, all substantially at the same time. Thus, upon generation of a specified voltage difference resulting from the well resistance Rnw of N-well 21 and the well resistance Rpw of P-well 12, thyristor 20 is turned ON to thereby discharge a current $I_{SCR}$ to ground line GND1 with a low resistance.

As described above, the configuration, wherein the two thyristors are connected parallel to one another in the opposite directions between the first node N1 and the second node N2, allows one of the thyristors to be turned ON upon application of an ESD stress to any one of the first node N1 and the second node N2, to discharge the ESD stress to the other of the nodes N1 and N2. In addition, the ON-resistance of the thyristor in an ON-state is significantly lower than the ON-resistance of a diode having similar dimensions, whereby a desired low resistance during discharge of the ESD current can be achieved with smaller dimensions for the protection device. This allows the parasitic capacitances of the ground lines, which are desired to be separated from one another during a normal operation of the LSI, to assume lower values, thereby suppressing propagation of noise via the parasitic capacitances.

A process for manufacturing the ESD protection circuit 40 of the present embodiment will be described hereinafter with reference to FIGS. 5A to 5F, which consecutively show fabrication steps of the ESD protection circuit 40 in sectional views thereof, taken along line A–A' in FIG. 2.

Exemplified dimensions of the ESD protection circuit 40 of FIG. 2 are such that heavily-doped N-type regions 13, 15, 23 and 25 have a length, Wn=50 µm, in Y-direction, heavily-doped P-type regions 14 and 24 have a length, Wp=50 µm, in Y-direction. The gap between heavily-doped P-type region 14 and the edge of N-well 11 opposing heavily-doped P-type region 14 in X-direction, as well as gap between heavily-doped P-type region 24 and the edge of N-well 21 opposing heavily-doped P-type region 21 in X-direction is set at dwa=0.4 µm, whereas the gap between heavily-doped N-type region 13 and the edge of N-well 11 opposing heavily-doped N-type region 13 in X-direction, as well as the gap between N-type region 23 and the edge of N-well 21 opposing heavily-doped N-type region 23 is set at dwc=0.4 µm. It is to be noted, however, that the accompanying figures are not depicted to any scale for a better understanding thereof.

Figure 5A:
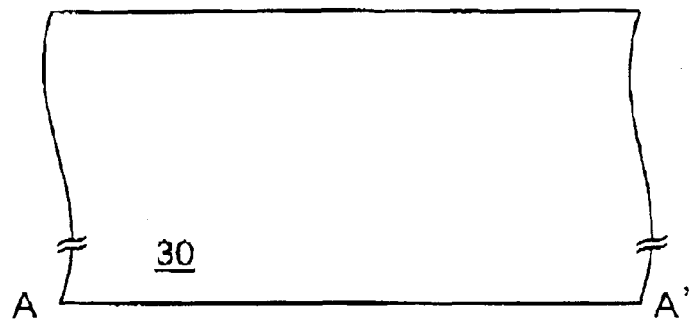
FIGS. 5A to 5F are sectional views consecutively showing fabrication steps in a process for fabricating the ESD protection circuit of FIG. 1.
Figure 5B:
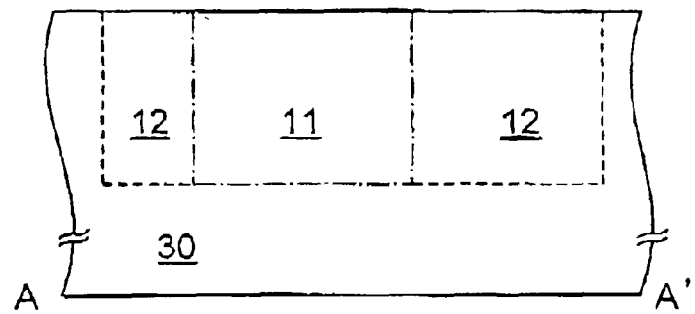

First, a p-type silicon substrate 30 is prepared having a specific resistance of around 10 Ω-cm, as shown in FIG. 5A. N-wells 11 and 21 having an impurity concentration around $5 \times 10^{17} cm^{-3}$ and P-well 12 having an impurity concentration around $5 \times 10^{17} cm^{-3}$ are then formed on the specified locations of the main surface of the silicon substrate 30 by using an ion implantation technique, as shown in FIG. 5B.

Figure 5C:
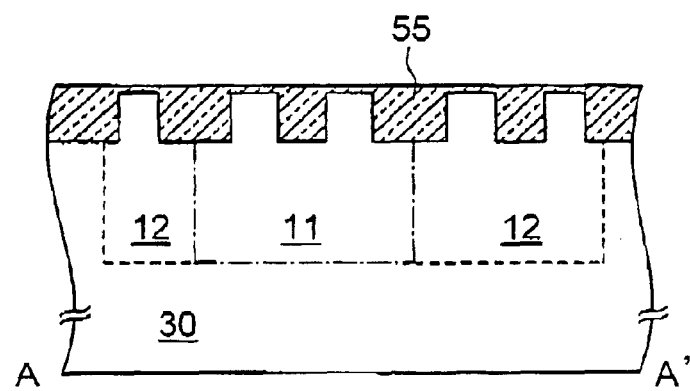

Subsequently, isolation trenches 55 are formed by using a shallow trench isolation technique for isolating device regions from one another, as shown in FIG. 5C. Thereafter, a gate insulation film (not shown) is grown on the silicon surface, followed by deposition of polysilicon and patterning thereof to form gate structures (not shown).

Figure 5D:
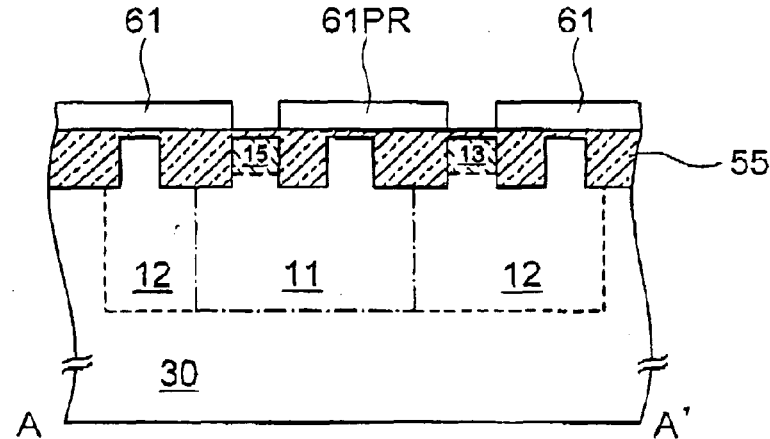

Subsequently, a photoresist pattern 61 is formed to cover regions other than desired regions to be ion-implanted, followed by ion-implanting the desired regions with arsenic (As), for example, by using the photoresist pattern 61 as a mask at an acceleration energy of 10 keV and at a dosage of about $1 \times 10^{15}/cm^2$ to form N-type regions including heavily-doped N-type regions 13 and 15, as shown in FIG. 5D.

Figure 5E:
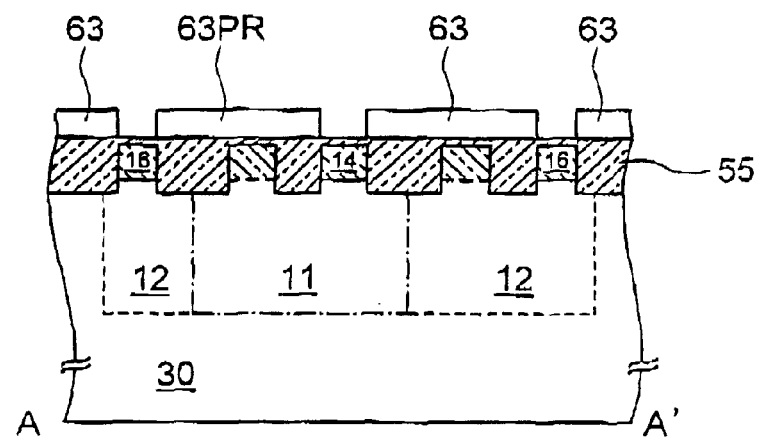

Subsequently, another photoresist pattern 63 is formed to cover regions other than desired regions to be ion-implanted, followed by ion-implanting the desired regions with boron (B) by using the another photoresist pattern 63 as a mask at an acceleration energy of about 5 keV and at a dosage of about $1 \times 10^{15}/cm^2$ to form P-type regions including heavily-doped P-type regions 14 and 16, as shown in FIG. 5E.

Figure 5F:
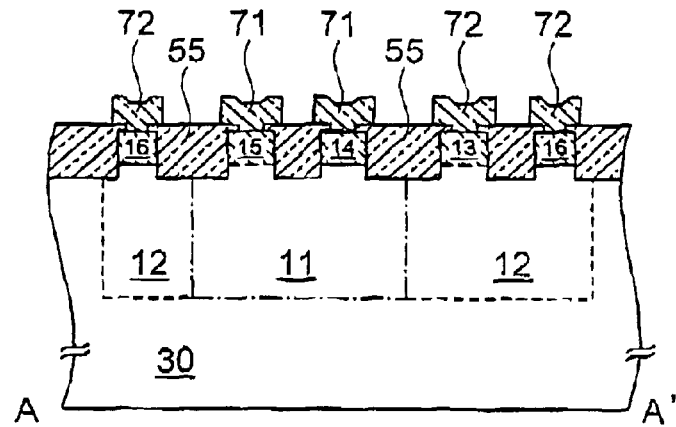
Figure 6A:
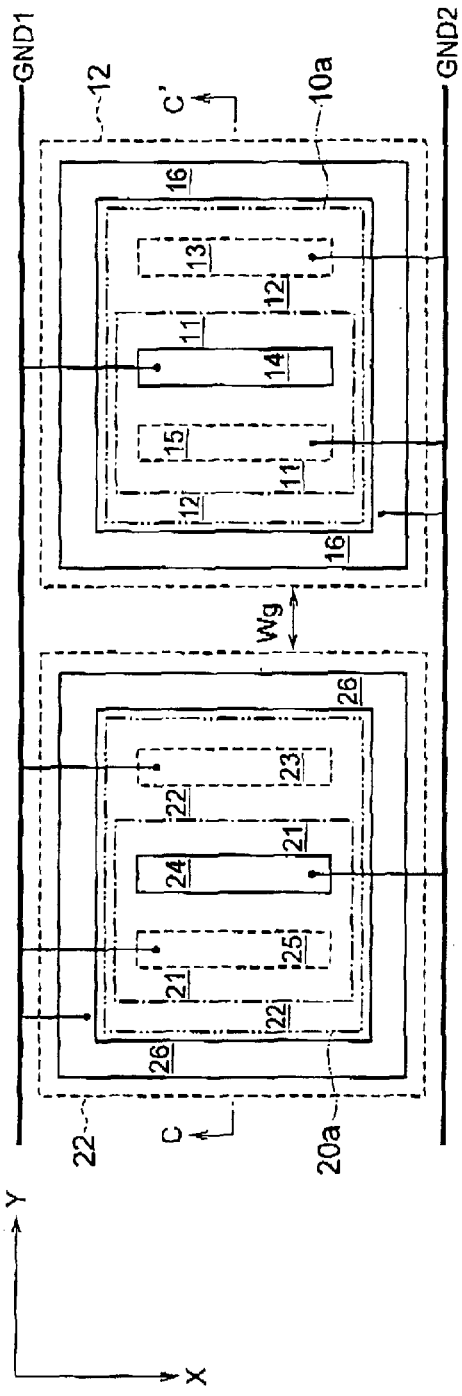
FIGS. 6A and 6B are schematic top plan view an ESD protection device of a first modification and a sectional view taken along line C–C' in FIG. 6A, respectively.
Figure 6B:
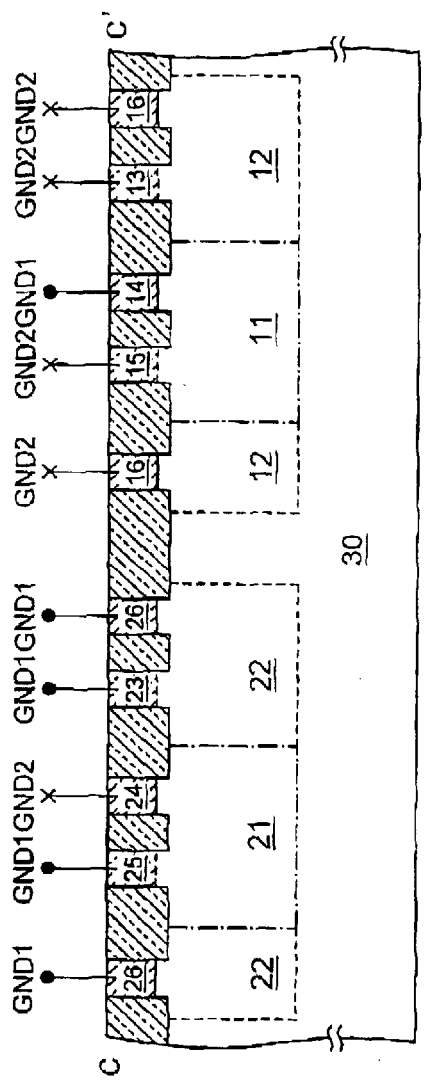

By using known processes, desired contact holes are formed, and interconnection lines 71 are formed by deposition and patterning of a conductive material such as a metal, as shown in FIG. 5F, followed by iterative deposition of an interlayer dielectric film, patterning thereof, deposition of a metal and patterning, thereof to obtain a multilayer interconnection structure.

The above processes have been used for forming a general CMOS LSI, and thus are not specific to the process for the ESD protection circuit of the present embodiment. In other words, no specific process is added to the fabrication process for the general CMOS LSI, and the process conditions and pattern dimensions in the above processes can be selected as desired while conforming to the process conditions for the general CMOS LSI and the ESD performance of the ESD protection circuit of the present embodiment.

It is to be noted that the present invention is not limited to the exemplified embodiment as described above. For example, the patterned shapes of the protection circuit may be changed as desired. The following modifications from the above embodiment can be exemplified, wherein first-conductivity-type and second-conductivity-type are P-type and N-type, respectively, and the protection devices are formed on the main surface of a P-type silicon substrate, as in the case of the above embodiment.

Figure 7A:
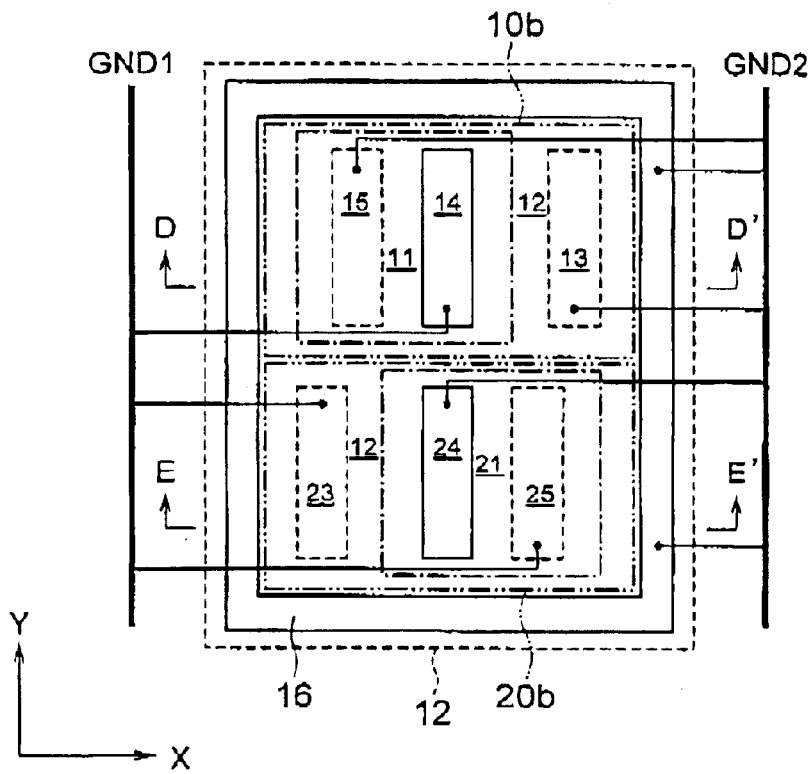
FIGS. 7A and 7B are schematic top plan view an ESD protection device of a second modification and a sectional view taken along line E–E' in FIG. 6A, respectively.
Figure 7B:
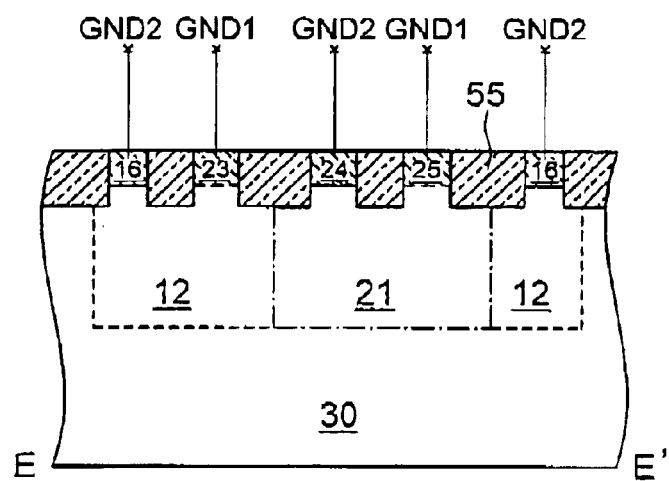

Referring to FIGS. 7A and 7B, there is shown a first modification from the above embodiment, wherein thyristor 10 and thyristor 20 are formed within different P-wells. More specifically, the semiconductor substrate 30 includes therein a first well (N-well) 11, a second well (N-well) 21 disposed apart from N-well 11, a third well (P-well) 12 encircling N-well 11, a fourth well (P-well) 22 encircling N-well 21 and disposed apart from P-well 12.

A first diffusion region (heavily-doped N-type region) 13 having a higher impurity concentration than N-well 11 is disposed within P-well 12 to oppose N-well 11, and acts as a first node or first line, which is connected to ground line GND2. A second diffusion region (heavily-doped N-type region) 23 having a higher impurity concentration than N-well 21 is disposed within P-well 22 to oppose N-well 21, and acts as a second node or second line, which is connected to ground line GND1.

A third diffusion region (heavily-doped N-type region) 15 having a higher impurity concentration than N-well 11 is disposed within N-well 11 and connected to ground line GND2. A fourth diffusion region (heavily-doped N-type region) 25 having a higher impurity concentration than N-well 21 is disposed within N-well 21 and connected to ground line GND1. A fifth diffusion region (heavily-doped P-type region) 14 having a higher impurity concentration than P-well 12 is disposed within N-well 11 between heavily-doped N-type region 13 and heavily-doped N-type region 15, and connected to ground line GND1. A sixth diffusion region (heavily-doped P-type region) 24 having a higher impurity concentration than P-well 12 is disposed within N-well 21 between heavily-doped N-type region 23 and heavily-doped N-type region 25, and connected to ground line GND2. A seventh diffusion region (heavily-doped P-type region) 16 having a higher impurity concentration than P-well 12 is disposed in the peripheral area of P-well 12, and connected to ground line GND2.

An eighth diffusion region (heavily-doped P-type region) 26 having a higher impurity concentration than P-well 22 is disposed in the peripheral area of P-well 22, and connected to ground line GND1.

N-well 11, P-well 12, heavily-doped N-type region 13 and heavily-doped P-type region 14 collectively form a thyristor 10a, wherein heavily-doped N-type region 13, heavily-doped P-type region 14 and N-well 11 act as cathode, anode and gate, respectively. Similarly, N-well 21, P-well 22, heavily-doped N-type region 23 and heavily-doped P-type region 24 collectively form a thyristor 20a, wherein heavily-doped N-type region 23, heavily-doped P-type region 24 and N-well 21 act as cathode, anode and gate, respectively.

N-well 11 and N-well 21 both of a rectangular shape are disposed apart from one another in Y direction. P-well 12 and P-well 22 both of a rectangular shape encircle N-well 11 and N-well 21, respectively, and are disposed apart from one another in Y-direction.

Heavily-doped N-type region 13 is of a rectangular shape, disposed in P-well 12 apart from N-well 11 in Y-direction, has an edge extending in X-direction and opposing the edge of N-well 11 extending in X-direction. Heavily-doped N-type region 23 is of a rectangular shape, disposed in P-well 22 apart from N-well 21 in Y-direction, has an edge extending in X-direction and opposing the edge of N-well 21 extending in X-direction.

Heavily-doped P-type region 14 and heavily-doped N-type region 15 are disposed in N-well 11 apart from one another in Y-direction, and have edges extending in X-direction opposing one another. Heavily-doped P-type region 14 is sandwiched between heavily-doped N-type region 13 and heavily-doped N-type region 15. Heavily-doped P-type region 24 and heavily-doped N-type region 25 are disposed in N-well 21 apart from one another in Y-direction, and have edges extending in X-direction opposing one another. Heavily-doped P-type region 24 is sandwiched between heavily-doped N-type region 23 and heavily-doped N-type region 25.

Heavily-doped P-type region 16 is disposed along the whole periphery of P-well 12 apart from any of N-well 11 and heavily-doped N-type region 13, and acts as a contact area for P-well 12 and a guard ring for thyristor 10a, Similarly, Heavily-doped P-type region 26 is disposed along the whole periphery of P-well 22 apart from any of N-well 21 and heavily-doped N-type region 23, and acts as a contact area for P-well 22 and a guard ring for s thyristor 20a.

In the above first modification, thyristors 10a and 20a have a four-region structure similarly to thyristors 10 and 20 in the above embodiment. The guard ring of thyristor 10a implemented by heavily-doped P-type region 16 is connected to ground line GND2, whereas the guard ring of thyristor 20a implemented by heavily-doped P-type region 26 is connected to ground line GND1. In this configuration, if an ESD stress is applied to cause a current flowing from ground line GND1 to ground line GND2, thyristor 10a acts as the protection device similarly to thyristor 10 in the above embodiment. On the other hand, if an ESD stress is applied to cause a current flowing from ground line GND2 to ground line GND1, thyristor 20a acts as the protection device similarly to thyristor 20 in the above embodiment. That is, a symmetrical operation of the protection circuit can be achieved between ground line GND1 and ground line GND2.

It is to be noted, however, that heavily-doped P-type regions 16 and 26 are connected to ground lines GND2 and GND1, respectively, and that ground line GND1 and ground line GND2 are connected together via the P-type silicon substrate 30. Thus, for effectively suppressing propagation of high-frequency noise between the ground lines, or between power source systems, the gap Wg between heavily-doped P-type region 16 and heavily-doped P-type region 26 should be a sufficient distance depending on the specific resistance of the P-type silicon substrate 30. In the first modification, both heavily-doped P-type regions 16 and 26 may be connected to -either one of ground lines GND1 and GND2 as well.

Referring to FIGS. 7A and 7B, there is shown a second modification from the above embodiment. In this modification, thyristor 20b has a configuration, which is obtained by reversing the structure of thyristor 20 shown in FIG. 2 with respect to the central line of P-well 12 in X-direction. Other configurations of the second modification is similar to those of the above embodiment including the structure and function of thyristors 10b and 20b as well as the connections to ground lines GND1 and GND2.

Figure 8A:
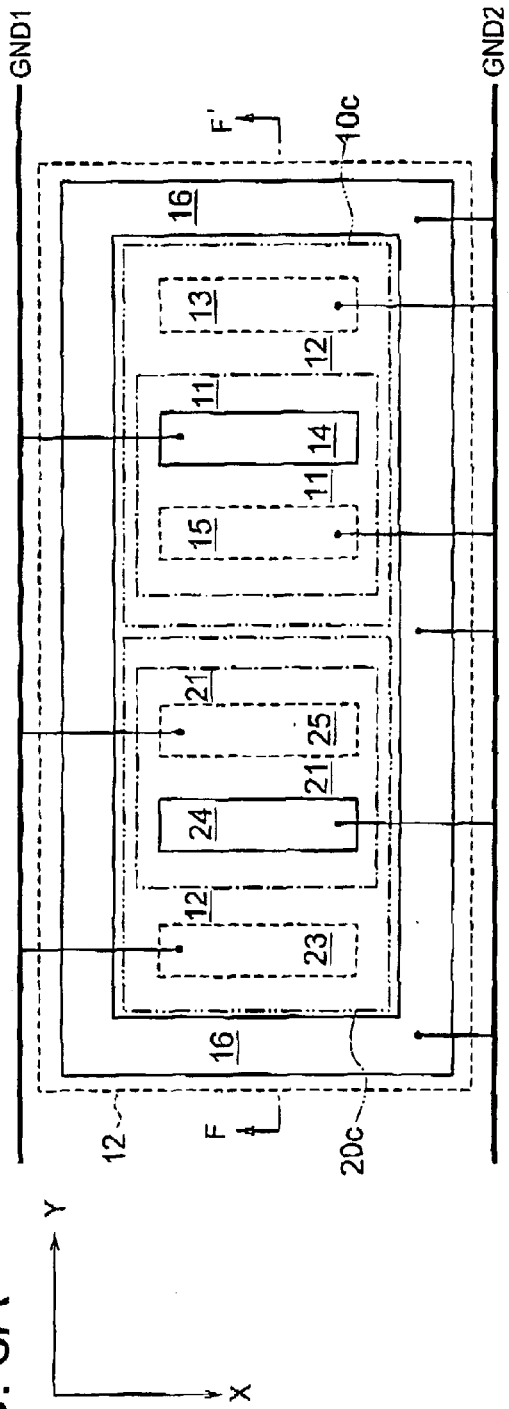
FIGS. 8A and 8B are schematic top plan view an ESD protection device of a third modification and a sectional view taken along line F–F' in FIG. 8A, respectively.
Figure 8B:
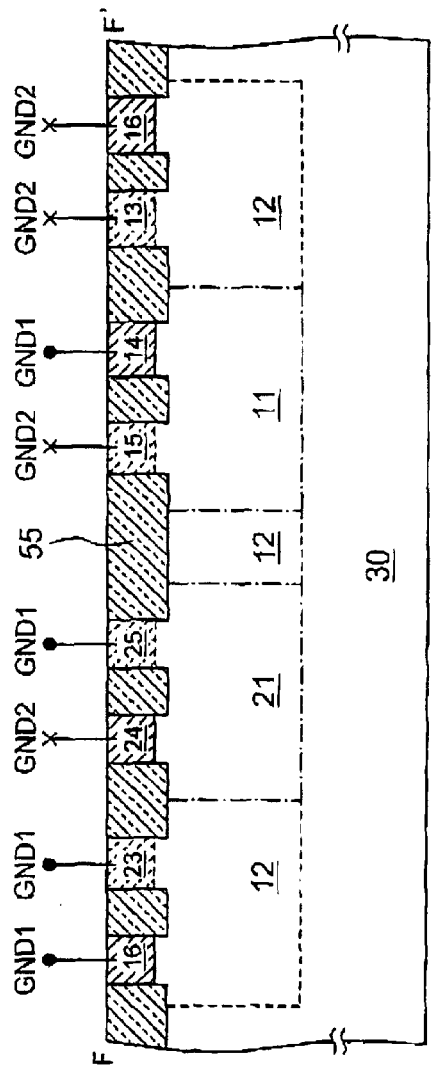

Referring to FIGS. 8A and 8B, there is shown a third modification from the above embodiment. This modification is obtained by rotating the structure of thyristors 10 and 20 by 90 degrees to re-arrange the regions in Y-direction. In other words, this modification is obtained by combining P-well 12 and P-well 22 together from the first modification, which may be connected to ground line GND1 or GND2. The ESD protection circuit of this modification is disposed between ground line GND1 and ground line GND2 extending in Y-direction. This modification has an advantage that the patterning design for the connections between the ground lines and the regions is simplified.

Figure 9A:
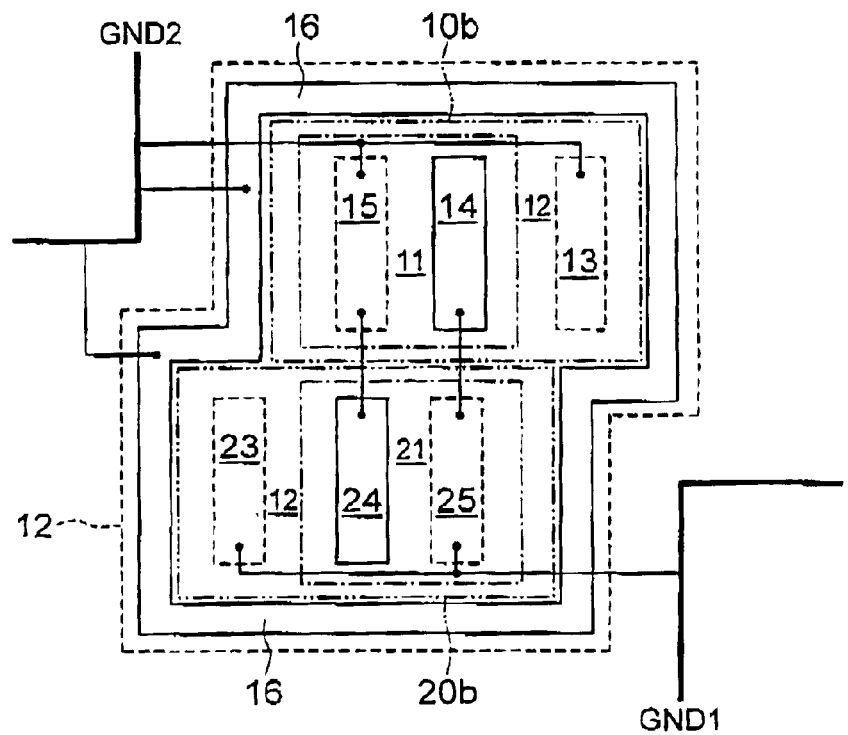
FIGS. 9A and 9B are schematic top plan views of ESD protection devices of further modifications from the second modification.
Figure 9B:
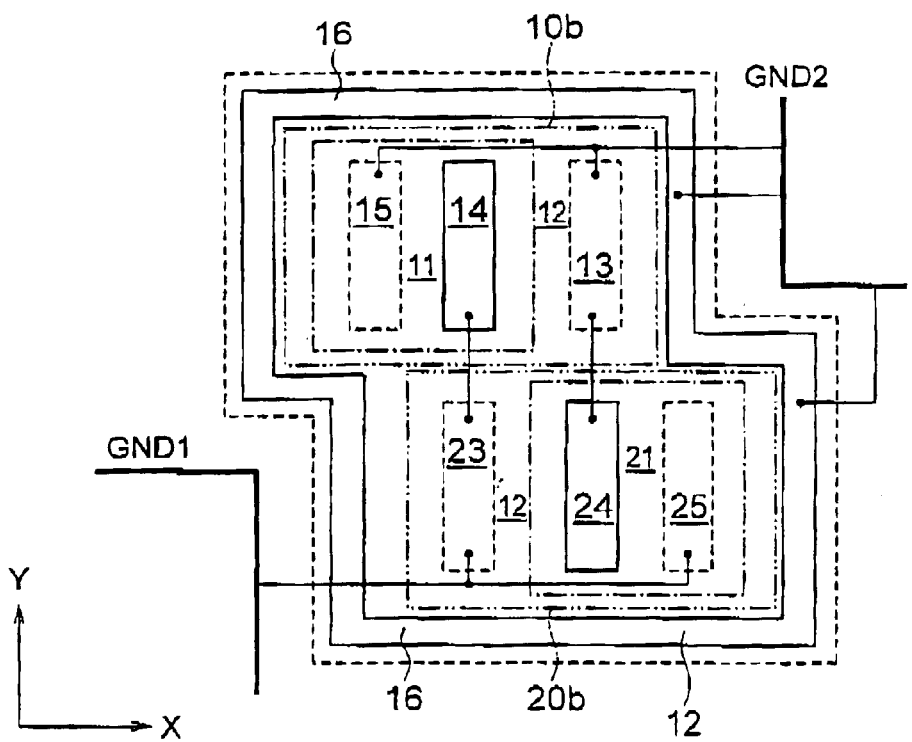
Figure 10:
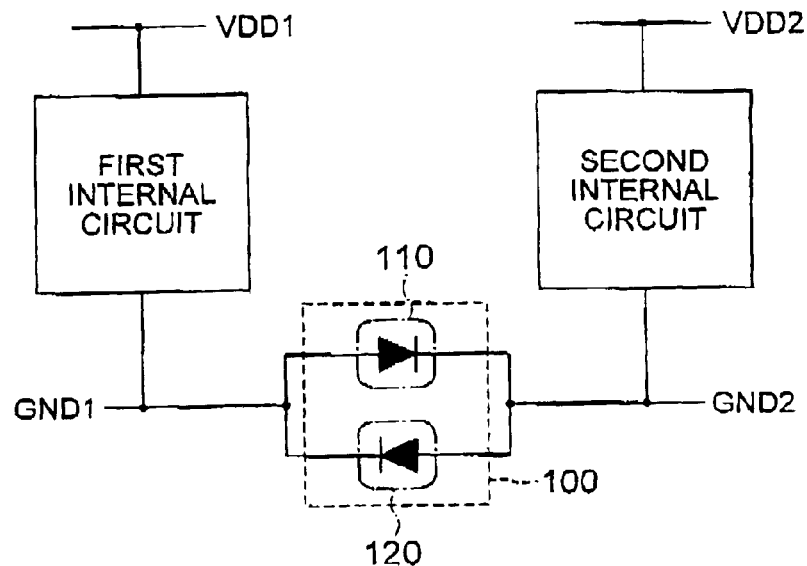
FIG. 10 is an equivalent circuit diagram of a conventional ESD protection device connected between ground lines of different power source systems.
Figure 11:
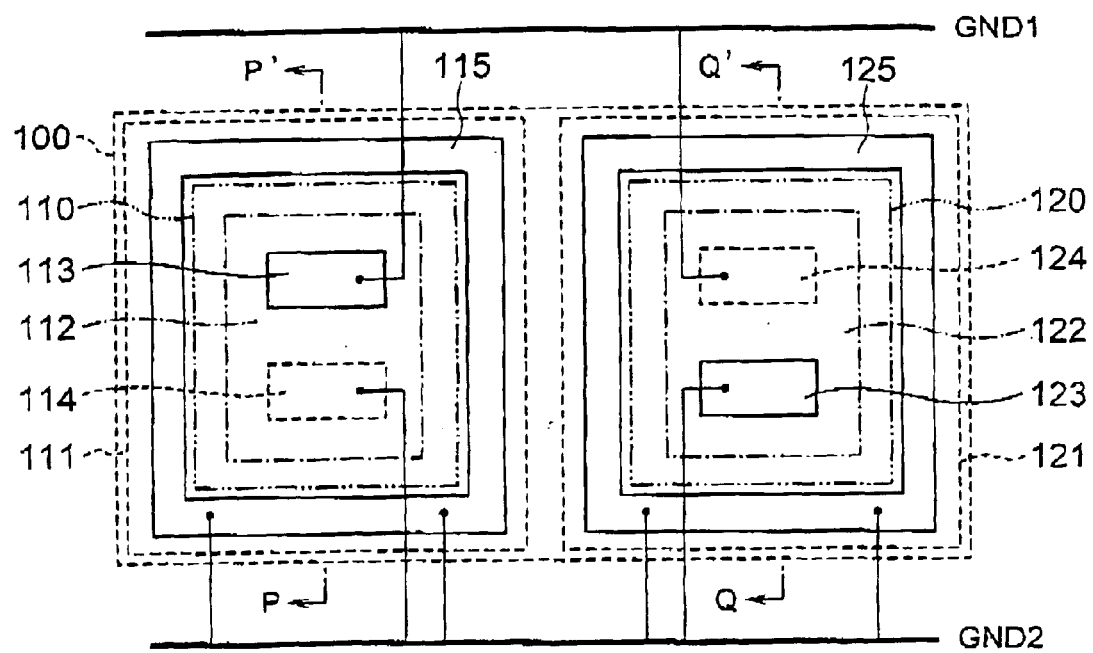
FIG. 11 is a schematic top plan view of the layout of the ESD protection device of FIG. 10.
Figure 12A:
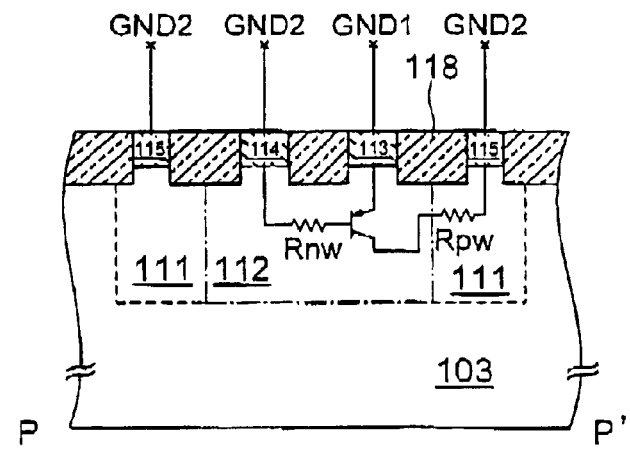
FIGS. 12A and 12B are sectional view taken along line P–P' in FIG. 11, and a corresponding equivalent circuit diagram, respectively.
Figure 12B:
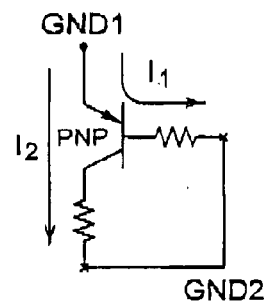
Figure 13A:
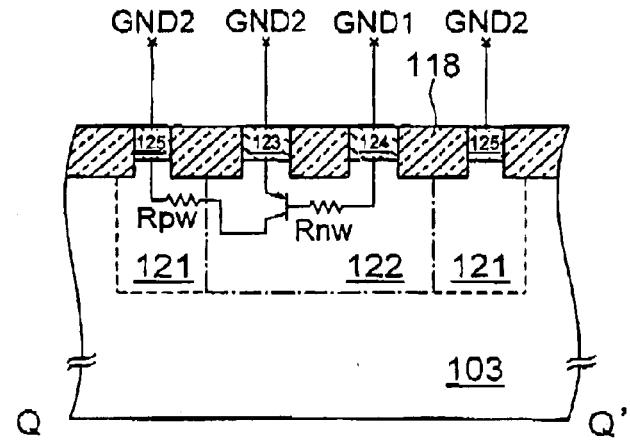
FIGS. 13A and 13B are sectional view taken along line Q–Q' in FIG. 11, and a corresponding equivalent circuit diagram, respectively.
Figure 13B:
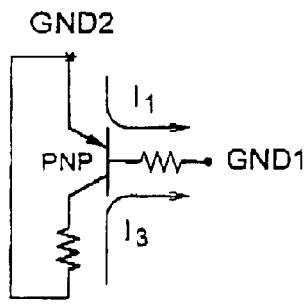

FIGS. 9A and 9B show further modifications from the second modification. These modifications are preferably employed in the case wherein a suitable rectangular area is not found between the ground lines GND1 and GND2. In these modifications, there is an offset in X-direction between the pattern of thyristor 10 and the pattern of thyristor. 20, wherein a region 15, for example, of thyristor 10b aligned with a region 24 of thyristor 20b in X-direction is connected via a line extending in Y-direction.

As described above, the pattern of the ESD protection circuit may be selected to achieve a compact size depending on the locational relationship between the ground lines to be protected and between the ground lines and the ESD protection circuit.

Figure 14A:
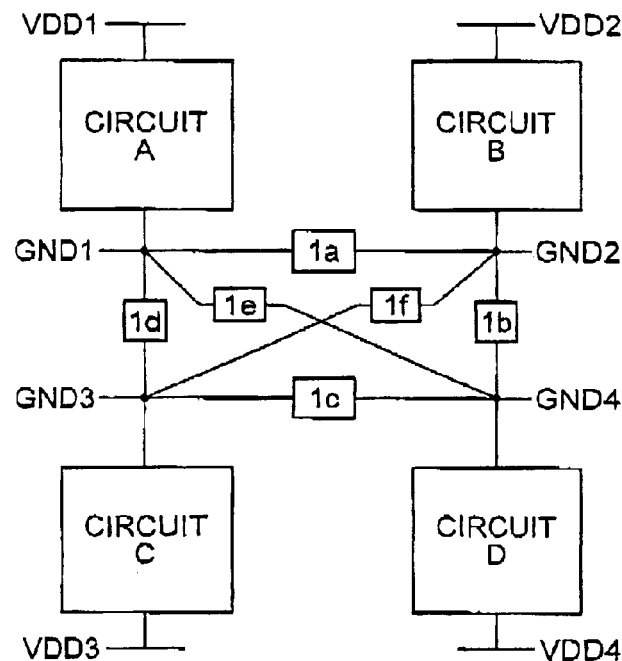
FIGS. 14A and 14B are block diagrams of LSIs showing ESD protection circuits connected between internal circuits.
Figure 14B:
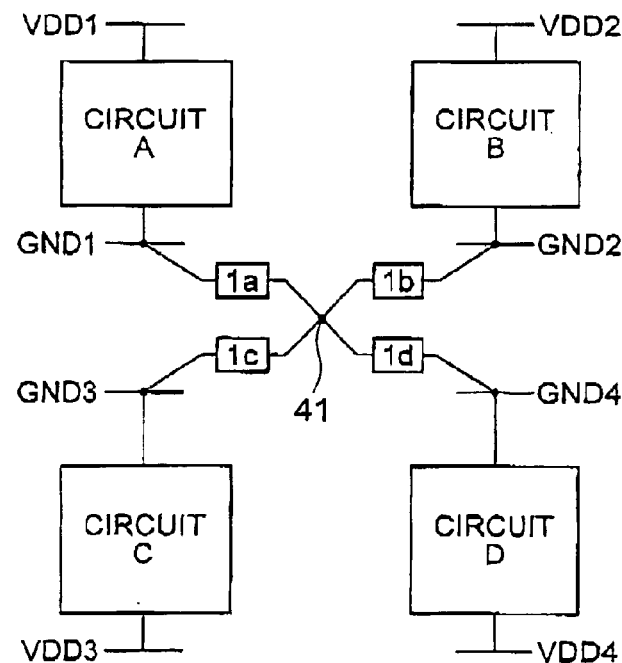

FIGS. 14A and 14B show ESD protection circuits in LSIs having four power source systems as exemplified cases of LSIs including a larger number of power source systems. In FIG. 14A, each of ESD protection circuits 1a to 1f according to the present invention is disposed between each two of the ground lines GND1 to GND4 for the internal circuits having different power source systems. In FIG. 14B, a common node 41 is provided for the four ground lines GND1 to GND4, wherein each ESD protection circuit 1a to 1d of the present invention is disposed between the common node 41 and a corresponding one of the ground lines GND1 to GND4. In the case of FIG. 14B, although the ESD protection circuits operate with a slightly higher voltage between the ground lines, the number of ESD protection circuits can be reduced.

Since the above embodiments are described only for examples, the present invention is not limited to the above embodiments and various modifications or alterations can be easily made therefrom by those skilled in the art without departing from the scope of the present invention.

What is claimed is:

1. An electrostatic discharge (ESD) protection circuit comprising:
   first and second nodes;
   a first thyristor having an anode connected to said first node, and a cathode arid a gate both connected to said second node; and
   a second thyristor having an anode connected to said second node, and a cathode and a gate both connected to said first node,
   whereby said ESD protection circuit discharges an ESD current, applied to said first node, toward said second node, and discharges an ESD current, applied to said second node, toward said first node,
   wherein each of said first thyristor and said second thyristor has a four-region structure including a first well of a first conductivity type, a first diffusion region of a second conductivity type formed in said first well, said second conductivity type being opposite to said first conductivity type, a second well of said second conductivity type, and a second diffusion region of said first conductivity type formed in said second well.

2. The ESD protection circuit according to claim 1, wherein said first and second conductivity types are P-type and N-type, respectively.

3. An ESD protection circuit formed on a semiconductor substrate of a first conductivity type, comprising:
   first and second nodes;
   a first well of a second conductivity type opposite to said first conductivity type, a second well of said second conductivity type disposed apart from said first well, and a third well of said first conductivity type encircling said first and second wells and connected to said first node, said first through third wells being formed in a surface region of said semiconductor substrate;
   a first diffusion region of said second conductivity type, having a higher impurity concentration than said first well, formed in said third well to oppose said first well, and connected to said first node;
   a second diffusion region of said second conductivity type, having a higher impurity concentration than said second well, formed in said third well to oppose said second well, and connected to said second node;
   a third diffusion region of said second conductivity type, having a higher impurity concentration than said first well, formed in said first well, and connected to said first node;
   a fourth diffusion region of said second conductivity type, having a higher impurity concentration than said second well, formed in said second well, and connected to said second node;
   a fifth diffusion region of said first conductivity type, having a higher impurity concentration than said third well, formed in said first well apart from said third well, and connected to second node; and
   a sixth diffusion region of said first conductivity type, having a higher impurity concentration than said third well, formed in said second well apart from said fourth diffusion region, and connected to said first node.

4. The ESD protection circuit according to claim 3, wherein said first diffusion region has an edge opposing and extending parallel to an edge of said first well.

5. The ESD protection circuit according to claim 3, wherein said second diffusion region has an edge opposing and extending parallel to an edge of said second well.

6. The ESD protection circuit according to claim 3, wherein said fifth diffusion region is disposed between said first diffusion region and said third diffusion region.

7. The ESD protection device according to claim 3, said sixth diffusion region is disposed between said second diffusion region and said fourth diffusion region.

8. An electrostatic discharge (ESD) protection circuit comprising:
   first and second nodes;
   a first thyristor having an anode connected to said first node, and a cathode and a gate both connected to said second node; and
   a second thyristor having an anode connected to said second node, and a cathode and a gate both connected to said first node,
   whereby said ESD protection circuit discharges an ESD current, applied to said first node, toward said second node, and discharges an ESD current, applied to said second node, toward said first node,
   wherein said first node and said second node have a common potential during a normal operation mode of a semiconductor device including said ESD protection device.

9. A semiconductor device comprising:
   a plurality of separate power source systems, and
   at least one electrostatic discharge ESD protection circuit comprising
   first and second nodes;
   a first thyristor having an anode connected to said first node, and a cathode and a gate both connected to said second node; and
   a second thyristor having an anode connected to said second node, and a cathode and a gate both connected to said first node,
   whereby said ESD protection circuit discharges an ESD current, applied to said first node, toward said second node, and discharges an ESD current, applied to said second node, toward said first node, and
   wherein said first and second nodes are connected to a ground line of one of said power systems and a ground line of another of said power systems, respectively.

10. An ESD protection circuit formed on a semiconductor substrate of a first conductivity type, comprising:

first and second nodes;

a first well of a second conductivity type opposite to said first conductivity type, a second well of said second conductivity type disposed apart from said first well, a third well of said first conductivity type encircling said first well and connected to said first node, and a fourth well of said first conductivity type encircling said second well, disposed apart from said third well and connected to said second node, said first through fourth wells being formed in a surface region of said semiconductor substrate;

a first diffusion region of said second conductivity type, having a higher impurity concentration than said first well, formed in said third well to oppose said first well, and connected to said first node;

a second diffusion region of said second conductivity type, having a higher impurity concentration than said second well, formed in said fourth well to oppose said second well, and connected to said second node;

a third diffusion region of said second conductivity type, having a higher impurity concentration than said first well, formed in said first well, and connected to said first node;

a fourth diffusion region of said second conductivity type, having a higher impurity concentration than said second well, formed in said second well, and connected to said second node;

a fifth diffusion region of said first conductivity type, having a higher impurity concentration than said third well, formed in said first well apart from said third well, and connected to second node; and a sixth diffusion region of said first conductivity type, having a higher impurity concentration than said fourth well, formed in said second well apart from said fourth diffusion region, and connected to said first node.

11. An ESD protection circuit formed on a semiconductor substrate of a first conductivity type, comprising:

first and second nodes;

a first well of a second conductivity type opposite to said first conductivity type, a second well of said second conductivity type disposed apart from said first well, a third well of said first conductivity type encircling said first well and connected to said first node, and a fourth well of said first conductivity type encircling said second well, disposed apart from said third well and connected to said first node, said first through fourth wells being formed in a surface region of said semiconductor substrate;

a first diffusion region of said second conductivity type, having a higher impurity concentration than said first well, formed in said third well to oppose said first well, and connected to said first node;

a second diffusion region of said second conductivity type, having a higher impurity concentration than said second well, formed in said fourth well to oppose said second well, and connected to said second node;

a third diffusion region of said second conductivity type, having a higher impurity concentration than said first well, formed in said first well, and connected to said first node;

a fourth diffusion region of said second conductivity type, having a higher impurity concentration than said second well, formed in said second well, and connected to said second node;

a fifth diffusion region of said first conductivity type, having a higher impurity concentration than said third well, formed in said first well apart from said third well, and connected to second node; and a sixth diffusion region of said first conductivity type, having a higher impurity concentration than said fourth well, formed in said second well apart from said fourth diffusion region, and connected to said first node.

* * * * *